(12) United States Patent
Finkler

(10) Patent No.: US 8,069,580 B2
(45) Date of Patent: Dec. 6, 2011

(54) MEASURING DEVICE FOR DETERMINING A POSITION AND/OR A SPEED

(75) Inventor: Roland Finkler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 324 days.

(21) Appl. No.: 12/437,101

(22) Filed: May 7, 2009

(65) Prior Publication Data

US 2009/0277033 A1      Nov. 12, 2009

(30) Foreign Application Priority Data

May 9, 2008  (EP) .................................. 08008768

(51) Int. Cl.
*G01D 5/249* (2006.01)
*G01D 5/347* (2006.01)
*G01D 5/12* (2006.01)
*G01D 5/48* (2006.01)
*G01P 3/00* (2006.01)

(52) U.S. Cl. ... 33/708; 33/707; 250/559.32; 250/231.18

(58) Field of Classification Search ............ 33/706, 33/707, 708; 250/231.13, 231.16, 231.14, 250/231.18, 231.32; 356/616, 617, 618, 356/619

See application file for complete search history.

(56) References Cited

U.S. PATENT DOCUMENTS

| | | | | |
|---|---|---|---|---|
| 4,126,047 A | * | 11/1978 | Sethares et al. | 73/504.01 |
| 4,225,931 A | * | 9/1980 | Schwefel | 702/150 |
| 4,631,519 A | * | 12/1986 | Johnston | 341/13 |
| 4,654,590 A | * | 3/1987 | Kitaura et al. | 324/207.13 |
| 4,654,636 A | | 3/1987 | Rusk | |
| 4,794,251 A | * | 12/1988 | Scholian | 250/231.17 |
| 5,206,586 A | | 4/1993 | Yauch et al. | |
| 5,294,793 A | * | 3/1994 | Schwaiger et al. | 250/231.16 |
| 5,317,614 A | | 5/1994 | Davis et al. | |
| 5,576,535 A | * | 11/1996 | Oosterwijk et al. | 250/231.18 |
| 6,556,153 B1 | | 4/2003 | Cardamone | |
| 6,640,451 B1 | * | 11/2003 | Vinarcik | 33/1 PT |
| 7,378,643 B2 | * | 5/2008 | Lum et al. | 250/231.13 |
| 7,408,654 B1 | * | 8/2008 | Hardin et al. | 356/617 |
| 2002/0017902 A1 | * | 2/2002 | Vasiloiu | 324/207.17 |

FOREIGN PATENT DOCUMENTS

DE     2729697 A1     1/1979

(Continued)

OTHER PUBLICATIONS

MTS Sensors; Temposonics; Positionssensoren Seiten 1 bis 3; Others; (= 2008Q06737).

*Primary Examiner* — Richard A Smith
(74) *Attorney, Agent, or Firm* — Henry M. Feiereisen; Ursula B. Day

(57) ABSTRACT

A measuring device for determining a position and/or a speed includes a scale having marks arranged at spacings from one another, and a scanning head, with the scale and the scanning head being arranged for movement relative to one another along a movement direction. The scanning head is constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing.

19 Claims, 5 Drawing Sheets

FOREIGN PATENT DOCUMENTS

| | | | |
|---|---|---|---|
| DE | 3410097 A1 * | 9/1985 | |
| EP | 0268558 A2 | 5/1988 | |
| EP | 0116636 B1 | 8/1988 | |
| EP | 0530176 B1 | 9/1996 | |
| EP | 1164358 A1 | 12/2001 | |
| JP | 56018717 A * | 2/1981 | |
| JP | 03189563 A * | 8/1991 | |
| WO | WO 8911080 | 11/1989 | |
| WO | WO 9325865 A1 | 12/1993 | |
| WO | WO 9932854 A1 * | 7/1999 | |

\* cited by examiner

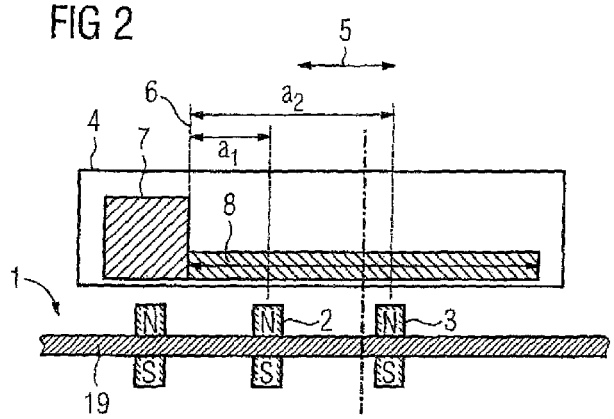 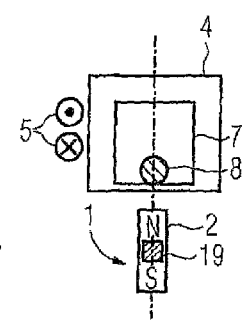
FIG 2    FIG 2a
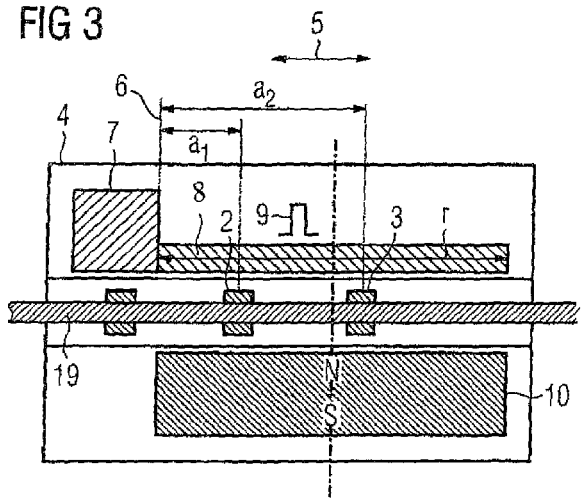 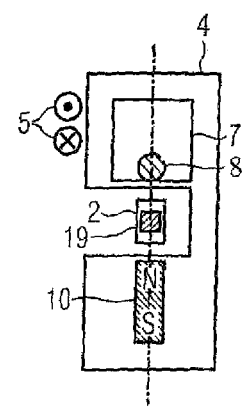
FIG 3    FIG. 3a

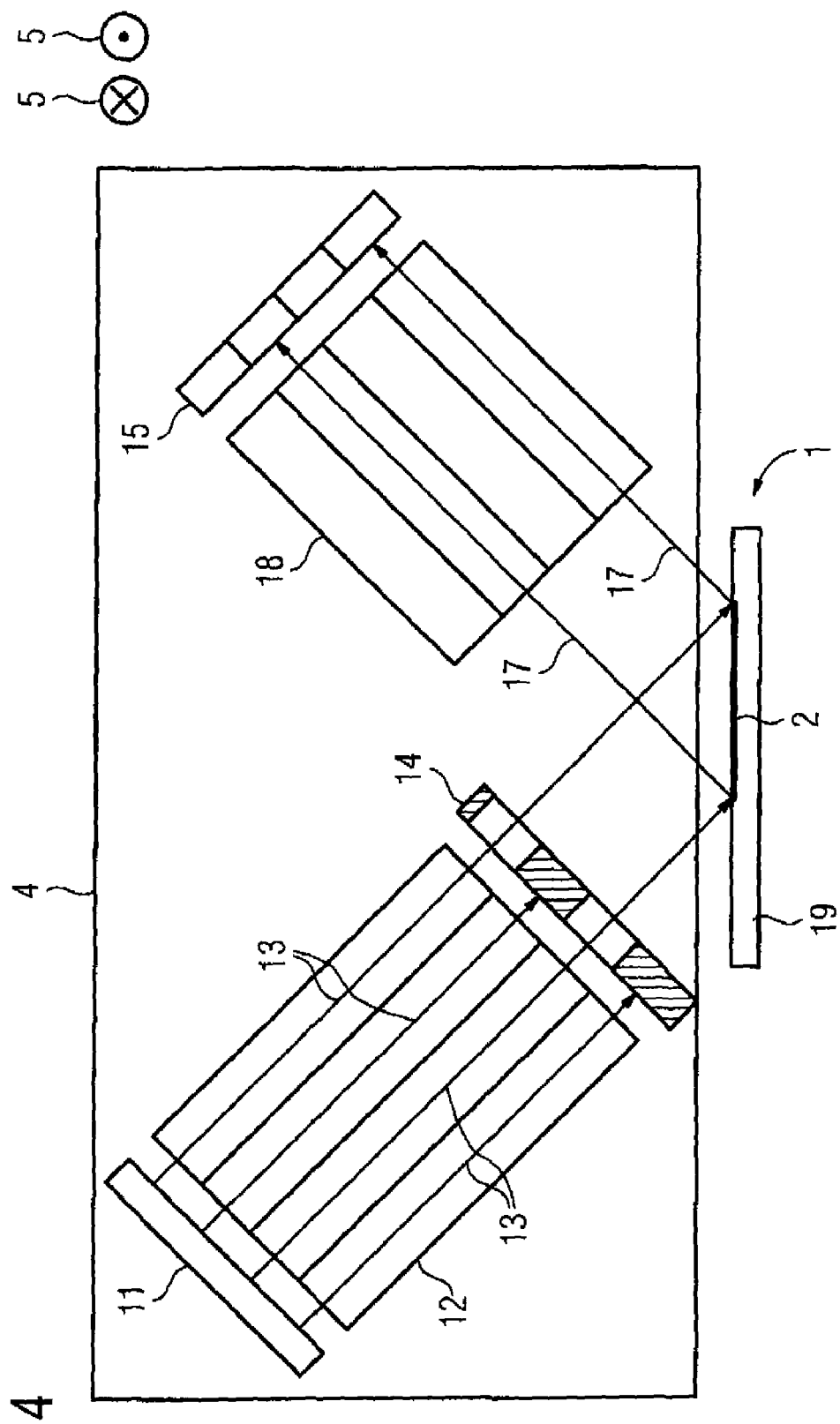

MEASURING DEVICE FOR DETERMINING A POSITION AND/OR A SPEED

CROSS-REFERENCES TO RELATED APPLICATIONS

This application claims the priority of European Patent Application, Serial No. EP08008768, filed May 9, 2008, pursuant to 35 U.S.C. 119(a)-(d), the content of which is incorporated herein by reference in its entirety as if fully set forth herein.

BACKGROUND OF THE INVENTION

The present invention relates to a measuring device for determining a position and/or a speed.

The following discussion of related art is provided to assist the reader in understanding the advantages of the invention, and is not to be construed as an admission that this related art is prior art to this invention.

Scale-based measuring systems have a so-called scale that, for example, in the case of a linear scale comprises a rod which is successively provided with marks at spacings. The accuracy of the position and/or speed determined by the measuring system depends in this case directly on the precision with which the marks can be arranged on the rod at the sites provided therefor. Particularly in the case of large scales, the highly precise arrangement of the marks on the measuring rod, or in the case of measuring systems for measuring a rotary movement, on a corresponding disk is very complicated and cost intensive for production of the scale.

It would therefore be desirable and advantageous to provide an improved measuring device for determining a position and/or a speed to obviate prior art shortcomings and to attain high accuracy in the determination of a position and/or a speed of a movable element.

SUMMARY OF THE INVENTION

According to one aspect of the present invention, a measuring device for determining a position and/or a speed includes a scale having marks arranged in spaced-apart relationship, and a scanning head, wherein the scale and the scanning head are arranged for movement relative to one another along a movement direction, said scanning head constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing.

A measuring device according to the present invention is able to operate at high accuracy, even though marks may be arranged less accurately than in the prior art.

According to another advantageous feature of the present invention, the first mark and the second mark may be arranged successively. As a result, it is possible to keep the dimension of the scanning head small in the movement direction.

According to another advantageous feature of the present invention, successive marks may be arranged with different spacings from one another, wherein each of the spacings between two successive marks is unique, i.e. it occurs or is present only once. This enables the scanning head to determine its absolute position on the scale. The marks form in this configuration a so-called absolute track.

According to another advantageous feature of the present invention, the marks can be arranged spaced apart equidistantly. When being arranged on a measuring rod at equidistant spacings, the marks can be applied to the rod particularly easily. In this configuration, the marks form a so-called incremental track.

According to another advantageous feature of the present invention, the marks can be designed as magnets or as magnetizable components, wherein the scanning head may include a measuring system for determining the first spacing and the second spacing, with the measuring system having a sensor device and a measuring rod which is defined by a length sized to at least correspond to a spacing between three successive marks, wherein the sensor device generates an electric pulse that traverses the measuring rod and generates a structure borne sound wave at each of at least two successive marks, with the sensor device recording a temporal arrival of the two structure borne sound waves. A particularly simple technical implementation can be attained by the combination of a propagation-time-measurement-based measuring system with a scale-based measuring system.

According to another advantageous feature of the present invention, the marks can be designed as magnets or as magnetizable components, wherein the scanning head may include at least two measuring systems for determining the first spacing and the second spacing, with each measuring system having a measuring rod and a sensor device which generates an electric pulse that traverses the measuring rod and generates a structure borne sound wave at one of the marks, with the sensor device recording a temporal arrival of the structure borne sound wave. This too enables a particularly simple technical implementation by combining a propagation-time-measurement-based measuring system with a scale-based measuring system.

According to another advantageous feature of the present invention, the measuring system or each of the measuring systems may have a magnet that magnetizes a single or a number of magnetizable components in immediate vicinity of the magnet. The number of magnets required can thereby be greatly reduced. Furthermore, the scale no longer needs to have any magnets.

According to another advantageous feature of the present invention, the marks may be designed in the form of reflecting marks, wherein the scanning head has at least three measuring systems, each having a light source for generating light, a code scale having transparent and opaque sites in accordance with a coding, and a detector, wherein the light source, the code scale, and the detector can be arranged to project a light distribution pattern onto the scale in accordance with the coding, with the detector detecting a part of the light distribution pattern which part has been reflected by a mark. Such a measuring system has the advantage that it can detect the position of the marks with high precision.

According to another advantageous feature of the present invention, the coding may be designed as Gray coding. As a result, adjacent code words differ from one another only by one bit, so that one of the two neighboring code words is always read in the transition region between the two code words. This enables a particularly reliable determination of the position and/or the speed.

According to another advantageous feature of the present invention, the measuring device can be constructed to ascertain a position to be expected from a penultimately determined position on the basis of the determined first spacing associated to the penultimately determined position and/or of the second spacing, and to detect in response to the determined first spacing associated to a last determined position and/or of the second spacing an incorrectly determined position and/or speed in the absence of a match between the last determined position and the position to be expected. This enables a reliable detection of an incorrectly determined position and/or speed that is a consequence of a fault in the measuring device, for example.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 2 is simplified a view of an exemplary embodiment of a measuring device according to the present invention;

FIG. 2a is a frontal view of the measuring device of FIG. 2;

FIG. 3 is a simplified view of a variation of a measuring device according to the present invention;

FIG. 3a is a frontal view of the measuring device of FIG. 3;

FIG. 4 is a simplified illustration of another exemplary embodiment of a measuring device according to the present invention based on light scanning;

DETAILED DESCRIPTION OF PREFERRED EMBODIMENTS

Figure 1:
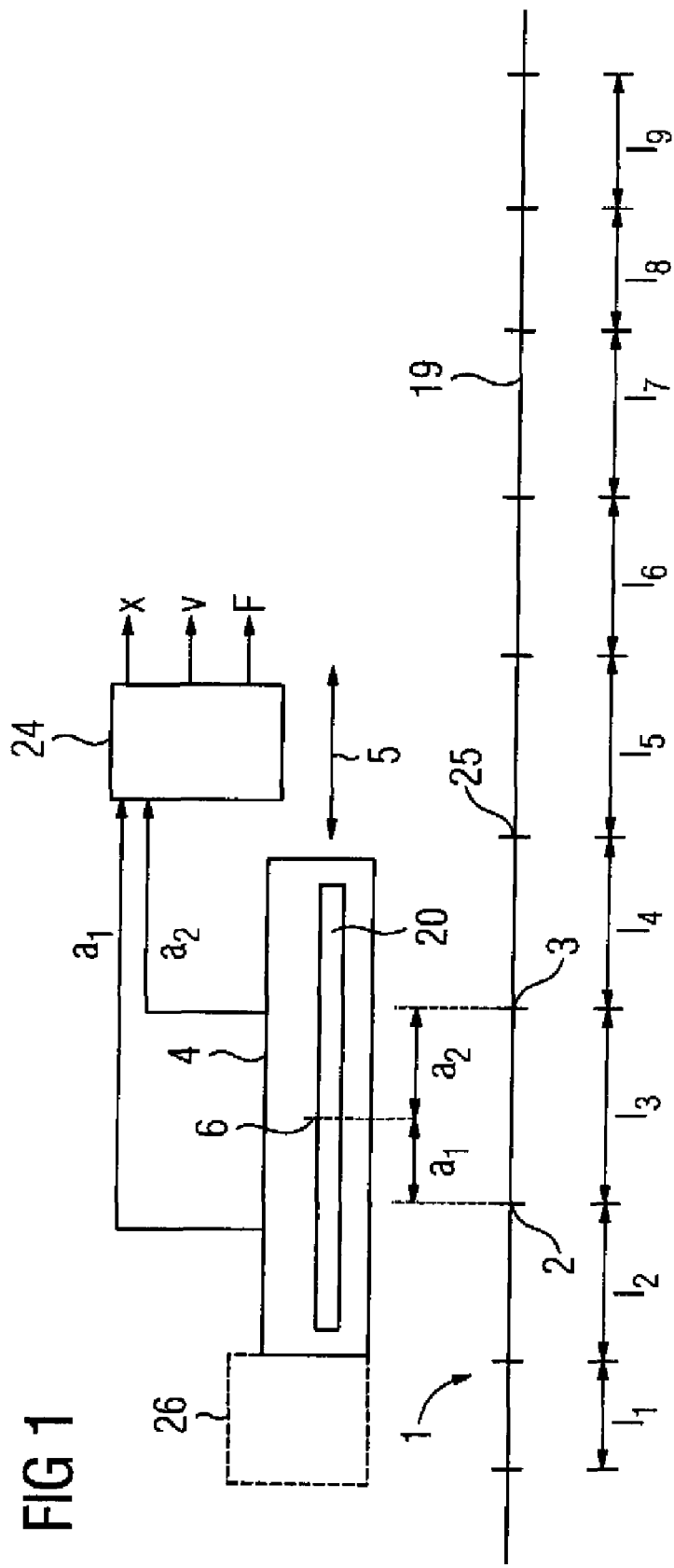
FIG. 1 is a schematic illustration of the principle of a measuring device according to the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a schematic illustration of a functional principle of a measuring device according to the present invention. Provided on a rod 19 are marks at different spacings from one another, for the sake of clarity only a first mark 2, second mark 3 and a third mark 25 being provided with reference symbols. The first mark 2 and the second mark 3 follow one another in this case. More accurately expressed, the first mark 2 and the second mark 3 are arranged to be directly successive. The individual marks in this case are all at different spacings $I_1$ to $I_9$ from one another. Together with the marks provided on it, the rod 19 forms a scale 1. Within the scope of the exemplary embodiment, the scale 1 is designed as a so-called linear scale, it also being possible, however, for the scale 1 to be designed as a rotary scale. In the case of a rotary scale, the rod 19 would be replaced by a corresponding circular disk on whose edge regions the marks are provided in a fashion correspondingly spaced apart from one another. In the case of the scale illustrated in FIG. 1, each spacing $I_1$ to $I_9$ ($I_i$, where i=1 ... 9) is present only once, that is to say all the spacings $I_1$ to $I_9$ have a different size.

In addition to the scale 1, the inventive measuring device has a scanning head 4. The scanning head 4 moves in this case along a movement direction 5 that runs parallel to the rod 19. In the context of the exemplary embodiment, the scanning head 4 is coupled here to the movable element 26, whose position x and/or speed v are to be determined by means of the inventive measuring device, the movable element 26 being drawn in FIG. 1 by dashes in a schematic fashion. The movable element 26 can be present, for example, in the form of a workpiece carriage of a machine tool, on which the scanning head is fitted, while the scale 1 is fitted in a stationary fashion, for example on the machine bed of the machine tool. However, it is, of course, also possible for the scanning head 4 to be fitted in a stationary fashion while the scale 1 is also moved with the movable element. The movement direction 5 need not in this case necessarily, as illustrated in FIG. 1, be linear, but can also, for example, in the case of a rotary scale (disk on which marks are provided) run in a circular fashion if the movable element moves in a rotary fashion, the scale then being coupled, for example, to a motor shaft whose rotary position and rotational speed are to be determined by the inventive measuring device. The rotational speed can in this case also be present in the form of a rotational frequency. The position and/or the speed to be determined can therefore also be present in the form of a rotary position and/or rotational speed.

According to the invention, the scanning head 4 is used, preferably with regard to a reference point 6 of the scanning head, to determine a first spacing $a_1$ of the scanning head 4 in the movement direction 5 from a first mark 2, and a second spacing $a_2$ of the scanning head 4 in the movement direction 5 from a second mark 3. The first mark 2 and the second mark 3 are in this case arranged successively on the rod 19. The position of the reference point 6 of the scanning head can be fixed arbitrarily. The determination of the first spacing $a_1$ and of the second spacing $a_2$ is preferably performed in a fixed time frame. The scanning head 4 in this case simultaneously detects the first mark 2 and the second mark 3, the scanning head 4 having at least one measuring system 20 for determining the first and the second spacing.

On the basis of the different spacings $I_1$ to $I_9$, it is possible firstly to determine from the sum $a_1+a_2$ of the first spacing $a_1$ and the second spacing $a_2$ between which marks the scanning head 4 is currently located. In the example illustrated in accordance with FIG. 1, it is possible to determine with the aid of the relationship $I_3=a_1+a_2$ that the scanning head 4 is currently located between the first mark 2 and the second mark 3, since said marks currently exhibit exactly the spacing $I_3$ from one another, and otherwise no spacings exist between two successive marks that have the spacing $I_3$ from one another.

The accurate position x of the scanning head 4, that is to say more accurately put of the reference point 6 within the spacing $I_3$, is then ascertained from an evaluation of the first spacing $a_1$ and the second spacing $a_2$. Since the positions of the first mark 2 and the second mark 3 are known, the position of the reference point 6 can be determined, for example, by adding a1 to the known position of the first mark 2. Furthermore, the reference point can also be determined by subtracting the second spacing $a_2$ from the known position of the second mark 3. Thus, two position values are always available at the same time in order to ascertain the current position of the scanning head and therefore the position of the movable element. If, now, the first mark 2 and the second mark 3 are provided with a certain inaccuracy on the rod 19, for example in a fashion displaced slightly to the left or right, the two position values found in such a way can be improved, for example by averaging, that is to say the position of the movable element is yielded by forming the mathematical average between the position value that is yielded from adding the first spacing $a_1$ to the known position of the first mark 2, and the position value that is yielded from subtracting the second spacing $a_2$ from the known position of the second mark 3.

The speed of the movable element can be determined particularly accurately by means of the invention, since at the accuracy of the position difference $x_2-x_1$ between two successively determined positions $x_1$ and $x_2$, which is required to determine the speed $v=(x_2-x_1)/\Delta t$ (wherein $\Delta t$ is time difference between the traversal of the two positions) depends only on the measuring inaccuracy of the determined first spacing $a_1$ and the determined second spacing $a_2$. The position of the first mark 2 and of the second mark 3 thus no longer play a role in determining the speed of the movable element (they are eliminated mathematically in the calculation of the speed v), that is to say they become unnecessary for determining the speed and, in consequence, the accuracy of the determined speed is not negatively influenced by inaccurately provided marks on the rod 19 and, therefore, an inaccurate scale. This also applies whenever, between two successive detection instants of the spacings, the scanning head 4 changes from a region between two specific marks into the adjacent region.

Particularly as regards the determination of the speed, it follows that, in the case of the inventive measuring device the accuracy of the determined speed depends only on how accurately the first and the second spacings can be determined with reference to a reference point 6 of the scanning head, but no longer on the accuracy with which the marks are arranged on the rod 19.

In order to determine the position x and/or speed v of the movable element in the fashion described above, the measuring device has an evaluation unit 24 that reads in the two spacings $a_1$ and $a_2$ and, as described above, determines the position x and/or speed v therefrom and outputs them. The evaluation unit 24 can be implemented, as in FIG. 1, outside the scanning head 4, or else be a component of the scanning head 4.

Within the scope of the exemplary embodiment in accordance with FIG. 1, the position x of the reference point 6 of the scanning head 4 is determined by determining the spacings $a_1$ and $a_2$ between two successive marks. When the aim is to further improve the accuracy of the position x and/or speed v, it is also possible, in addition, to determine the spacings of the reference point 6 relative to a preferably sequentially arranged third mark 25 or yet further preferably sequentially arranged marks. To this end, the scanning head 4 must be designed in this case such that that, for example when the spacing of the reference point 6 from the third mark 25 is to be determined for the evaluation, said scanning head said scanning head can simultaneously detect the third mark 25 in addition to the first mark 2 and the second mark 3. The scanning head 4 has at least one measuring system 20 in order to determine the first spacing $a_1$ and the second spacing $a_2$.

A first design of the measuring system 20 for determining the first spacing $a_1$ and the second spacing $a_2$ is illustrated schematically in FIG. 2. The measuring system is implemented here as a magnetostrictive measuring system. The measuring system has a sensor device 7 and a measuring rod 8 arranged on the sensor device. The sensor device 7 generates in a fixed time array electric pulses 9 that traverse the measuring rod 8 in the form of current pulses. The scale 1 is formed by a rod 19 on which marks spaced apart from one another are provided in accordance with FIG. 1. In the embodiment in accordance with FIG. 2, the marks are designed as magnets, in particular permanent magnets. FIG. 2 illustrates the first mark 2 and the second mark 3, which are at the spacing $I_3$ from one another. Furthermore, illustrated to the left of the mark 2, is a further mark. For the sake of clarity, no further marks are illustrated to the right of mark 3. The three marks illustrated in FIG. 2 are successive. At their respective positions, the magnets generate a magnetic field that locally detects the measuring rod 8 at the respective position. At the positions of the first mark 2 and the second mark 3, the magnetic field carried along by the electric pulse 9 generates a mechanical torsion that generates inside the measuring rod 8 a so-called structure borne sound wave that runs back to the sensor device 7. Writing G for the speed of the structure borne sound wave, the first spacing $a_1$ is yielded as $$a_1 = G \cdot \Delta t_1,$$

and the second spacing $a_2$ as $$a2 = G \cdot \Delta t_2,$$

the time required for the electric pulse to reach the first mark 2 and the second mark 3 being neglected, that is to say the first spacing $a_1$ and the second spacing $a_2$ can be calculated from the time durations $\Delta t_1$ and $\Delta t_2$ respectively required by the structure borne sound wave in order to run back from the position of the respective permanent magnet to the sensor device 7. The respective time durations $\Delta t_1$ and $\Delta t_2$ are in this case the time durations between generation of the respective pulse and the recording of the respective pulse in the sensor device 7, the reference point 6 preferably being placed at the position of the input to the sensor device 7. Each electric pulse generates in such a fashion two structure borne sound waves with the aid of which the first spacing $a_1$ and the second spacing $a_2$ are determined with reference to a reference point 6. Illustrated to the right in FIG. 2 is a section through the inventive scanning head and the scale 1. The scanning head moves in the direction of the movement direction 5.

Thus, for the purpose of the implementation in the case of the preventive measuring device in a scale-based measuring system is advantageously combined with a propagation-time-based measuring system such as, for example magnetostrictive measuring system.

In order for the sensor device 7 also to be able to measure with one electric pulse both the first spacing $a_1$ and the second spacing $a_2$, the measuring rod 8 must have a length r that is at least as large as the spacing between three successive marks, in which case if the spacings between the marks differ, as illustrated in FIG. 1, the length r of the measuring rod 8 must be at least as large as the largest distance between three successive marks. It is thereby ensured that the measuring rod covers at least two marks in every position of the scanning head 4.

A further embodiment of the magnetostrictive measuring system, as illustrated in FIG. 2 and described in the above passage, is disclosed in FIG. 3. In its basic design, the embodiment illustrated in FIG. 3 corresponds substantially to the embodiment described above in FIG. 2. The same elements are therefore provided in FIG. 3 with the same reference symbols as in FIG. 2. The essential difference is that in the embodiment in accordance with FIG. 3 the marks are not designed in the form of magnets, but in the form of magnetizable components ($\mu_{rel} > 1$) such as, for example, an unmagnetized iron piece. Within the scope of the exemplary embodiment in accordance with FIG. 3, in this case the scanning head 4 has a magnet 10 that is preferably designed as a permanent magnet. As the scanning head glides past over the magnetizable components that form the marks, the magnetizable components currently located in the immediate vicinity of the magnet 10 are temporarily magnetized such that the magnets already illustrated in FIG. 2 are again produced temporarily as marks. Illustrated in FIG. 3 are the first mark 2 and the second mark 3, this time designed as magnetizable components, and a further mark arranged to the left of the mark. The magnetizable components serve in such a fashion, as it were, as magnetically conductive elements that specifically introduce the magnetic field of the magnet 10 at the positions of the marks in the measuring rod 8.

The respective associated sectional view is illustrated on the right in FIG. 2 and FIG. 3.

Instead of the individual magnetostrictive measuring systems described above, the scanning head 4 can also have a number of magnetostrictive measuring systems, in which case, for example, a first magnetostrictive measuring system is used to determine the first spacing $a_1$, and a second magnetostrictive measuring system is used to determine the second spacing $a_2$, the respective measuring rod 8 of the magnetostrictive measuring system no longer needs in this case to have a length that is at least as large as the spacing between three successive marks.

A further design of the scanning head 4 is illustrated in FIG. 4 in the context of a schematic sectional illustration. In the context of this design, the measuring system is designed as a light-based measuring system. The scanning head moves in the context of the exemplary embodiment in accordance with FIG. 4 along the movement direction 5, that is to say into the plane of the drawing or out of it in the illustration in accordance with FIG. 4. The measuring system has a light source 11, a first tube array 12, second tube array 18, a detector 15, and a code scale 14.

The light 13 generated by the light source 1 is guided by means of the first tube array 12 such that light 13 impinges on the code scale 14 only in a fashion perpendicular to the movement direction. The code scale 14 is assembled from transparent and opaque sites, and therefore only partially passes the light 13. The code scale 14 is illustrated on the left in FIG. 5 in the context of a plan view, the transparent sites being illustrated in white, and the opaque sites in black. The arrangement of the transparent and opaque sites a coding. In accordance with the coding of the code scale 14, that is to say in accordance with the arrangement of the transparent and opaque sites of the code scale 14, there is projected onto the scale 1 a light distribution pattern 16 that is shown in the middle illustration in FIG. 5. In the context of this exemplary embodiment, the scale 1 is designed as a flat rod 19 on which, as described in relation to FIG. 1, light reflecting marks in the form of narrow strips are provided at different spacings from one another. A first mark 2 is shown in the middle illustration in FIG. 5. The part of the light distribution pattern that is reflected by the first mark 2 is subsequently detected by a detector 15. If appropriate, a second tube array 18 (see FIG. 4), which passes only parallel light can be placed upstream of the detector 15 in order to mask out scattered light. The detector 15 is shown in the right-hand illustration in FIG. 5, the detector 15 detecting the reflected part 17 of the light distribution pattern 16. The detector 15 is preferably constructed in this case from strip-shaped individual detectors 22 that, as it were, integrate the incident light intensity. In the left-hand illustration in FIG. 5, it is to be observed that the code scale 14 has horizontal regions 23, with only a part of the horizontal regions being provided with reference numerals, for the sake of clarity. In accordance with the coding used for the code scale, a horizontal region constitutes a code word. In the case illustrated, the reflecting mark 2 guides exactly one individual of the code words onto the detector 15, and can be read there by the detector 15.

In general, however, a mixture composed of two adjacent code words will often result. For this reason, it is advantageous to have a so-called Gray coding in the case of which adjacent code words differ by only one bit such that, finally, always one of the two neighboring code words is read in the transition region. Gray codings are generally known to the person skilled in the art in this context.

The abovedescribed light-based measuring system functions in the way specified even if it is always only the reflected part of the light distribution pattern of an individual mark located just in the immediate vicinity of the measuring system during the process of movement that is detected by the detector 15. Consequently, each of the measuring systems must always be shorter than the shortest spacing between two successive marks over which it can be located. Consequently, in turn, positions of the scanning head are also possible in which a measuring system is currently not located over any mark, but between two successive marks. Consequently, the scanning head must have at least three of the abovedescribed light-based measuring systems, one measuring system serving to determine the first spacing $a_1$, and a further measuring system to determine the second spacing $a_2$.

Figure 6:
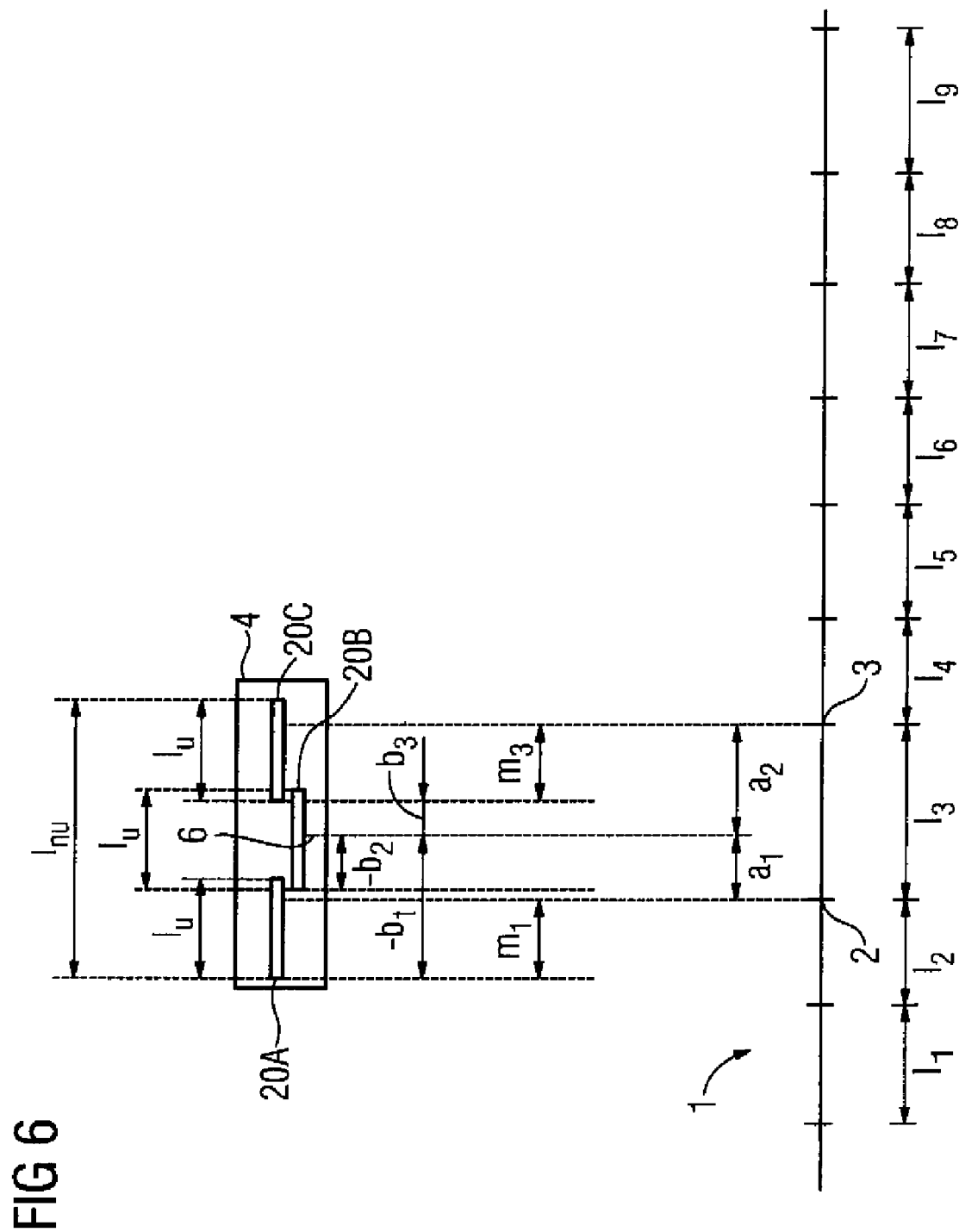
FIG. 6 is a schematic illustration of measuring device according to the present invention with a scanning head having three measuring systems.

FIG. 6 illustrates in the form of a schematic a scanning head that exhibits within the context of the exemplary embodiment the three light-based measuring systems 20A, 20B and 20C that preferably detect equal sublengths $I_u$ of the scale 1. The detection regions of the measuring systems 20A, 20B and 20C respectively overlap one another in this case to a small extent such that they detect overall the length $I_{nu} < n \cdot I_u$ of the scale 1, n being the number of the measuring systems, that is to say 3 in the context of the exemplary embodiment. If in this case the condition $$I_u < \min(I_i) \leq \max(I_i + I_{i+1}) < I_{nu} < n \cdot I_u$$

Ii: spacings between the marks, is fulfilled, at least two measuring systems can be used to determine the position at each position of the scanning head 4. It may be remarked at this juncture that the illustration in accordance with FIG. 6 is only a schematic one, and so in some circumstances the abovenamed relationship is not always fulfilled with the illustrated dimensions of the individual elements in FIG. 6.

Dimension $-b_1$, $-b_2$, $b_3$ ($b_1 < 0$, $b_2 < 0$, $b_3 > 0$) can be presupposed as known, since they result from the known geometry of the scanning head. In the example illustrated, the measuring systems 20A and 20C respectively detect one mark, the result being the measured variables $m_1$ and $m_3$. The first spacing $a_1$ and the second spacing $a_2$ are then yielded from the relationships $$a_1 = -b_1 - m_1,$$

$$a_2 = b_3 + m_3.$$

Corresponding relationships can be specified in an obvious way for the case in which the marks are located under a different two of the three measuring systems.

It may be remarked at this juncture that the reference point 6 to which the spacings relating to the nearest marks refer can be selected at any desired position along the scanning head 4. In accordance with the selected position of the reference point 6 on the scanning head 4, there must be a corresponding adaptation of the aforementioned mathematical relationships in order to determine the first spacing $a_1$ and the second spacing $a_2$. Within the context of the exemplary embodiment, the scanning head 4 outputs the first spacing $a_1$ and the second spacing $a_2$ as output variables. Alternatively, the scanning head can, however, also output the measured variables $m_1$ and $m_3$, and the aforementioned calculation of the first spacing $a_1$ and the second spacing $a_2$ from the measured variables $m_1$ and $m_3$ is carried out in the evaluation unit 24.

It may further be remarked at this juncture that, of course, the scale 1 can also be designed such that all the marks have the same spacing from one another. However, in this case when use is made of equally spaced marks there is generally a need to have at a location on the scale a reference point with the aid of which the measuring device is capable of referencing itself if it is desired to determine an absolute position. However, there is often also only a need to determine a speed so that it is possible to dispense with differently spaced marks, and the marks therefore all have the same spacing from one another.

Figure 5B:
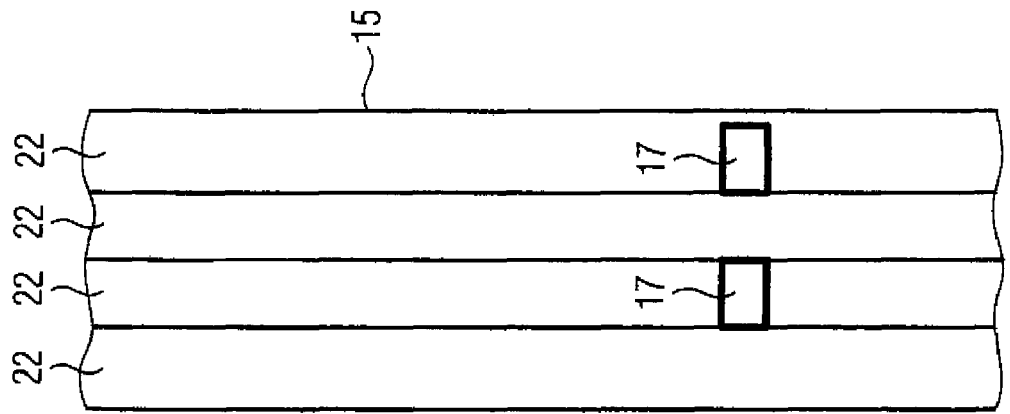
FIG. 5b is a simplified illustration of a detector of the scanning head to detect a reflected part of the light distribution pattern.
Figure 5A:
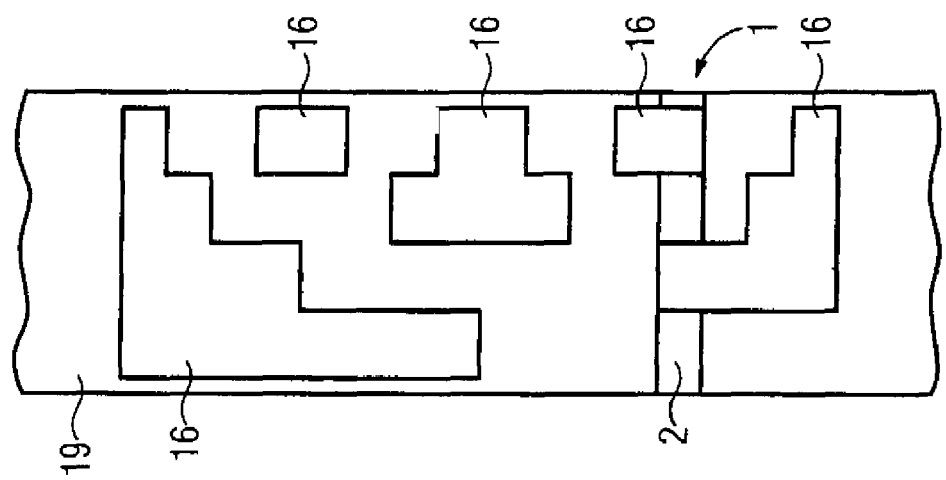
FIG. 5a is an illustration of a light distribution pattern generated in accordance with the code scale of FIG. 5.
Figure 5:
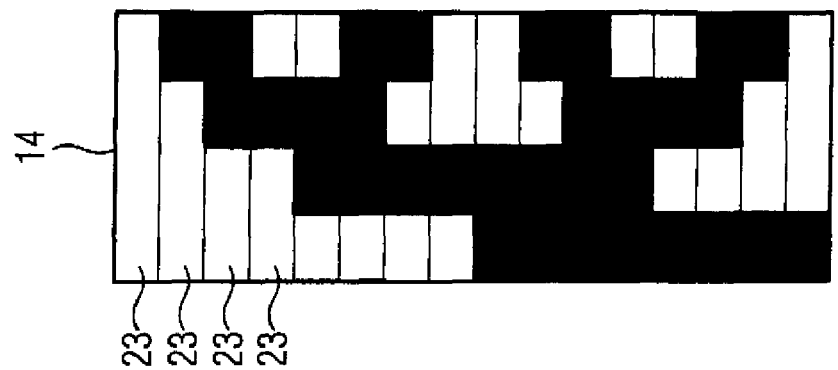
FIG. 5 is a plan view of a code scale of a scanning head of the measuring device of FIG. 4, depicting transparent sites in white, and opaque sites in black.

However, it is also possible in principle in the case of the invention to use other scales known in the case of measuring devices such as, for example, an absolute scale with parallel tracks and a parallel incremental track or a so-called PRBS scale with and without an additional incremental track. The reflecting part for the PRBS track extends in this case in accordance with the commercially employed length of the measuring system in which the scale is used as part of the scale and the individual detectors of the PRBS track are not arranged in a strip-shaped fashion and transverse to the movement direction, as illustrated in FIG. 5 on the right, but are arranged in the movement direction. The incremental track is, for example, in this case assigned precisely one individual detector that extends over half an increment in the movement direction.

It may be further remarked at this point that it is also conceivable to use the measuring system with the aid of an optical line camera, or of a non-optical analogue thereof. For example, such as non-optical analog can function inductively, for example, (for example in accordance with the AMOSIN® measuring principle, see EP1164358A1) or magnetically (for example in accordance with the gearwheel transmitter principle).

In the control and regulation of drives, the position values are mostly output by the measuring device in a fixed time array (every 125 µs). In this case, increased reliability requirements are also often placed on the measuring device in the sense that the measuring device is required to provide two position values determined independently of one another and which subsequently are checked for correspondence, for example. This requirement can be fulfilled with the aid of the inventive measuring device in the following way, the evaluation being carried out in the evaluation unit 24 in accordance with FIG. 1 in the context of the exemplary embodiment.

Firstly, a position $x_2^*$ to be expected is from the penultimately determined position $x_1$ (penultimately determined position value) in accordance with the relationship $$x_2^* = x_1 + a_1 - a_1'$$

$a_1'$ being the first spacing measured in order to determine the penultimately determined position $x_1$, and $a_1$ being the first spacing measured in order to determine the last determined position $x_2$ (last—that is to say the currently determined position value).

The position $x_2^*$ to be expected is subsequently compared with the last determined position $x_2$, and in the event of noncorrespondence, that is to say (absolute value $(x_2-x_2^*)$ > preset limit value) an incorrectly determined position is detected, and the evaluation unit 24 outputs an error signal F.

Instead of using the first spacings $a_1'$ and $a_1$, it is also possible in a similar way (see relationship below) to determine the position $x_2^*$ to be expected from the corresponding second spacings $a_2'$ and $a_2$, $a_2'$ being the second spacing measured in order to determine the penultimately determined position $x_1$, and $a_2$ being the second spacing measured in order to determine the last determined position $x_2$ (last—that is to say the currently determined position value).

$$x_2^* = x_1 + a_2' - a_2$$

Correspondingly, however, it is also possible to conceive more complex methods for ascertaining the position $x_2^*$ to be expected that, for example, ascertain the position $x_2^*$ to be expected by using all or some of the variables $x_1$, $a_1'$, $a_1$, $a_2'$, $a_2$, for example by means of averaging.

Furthermore, it may be remarked at this juncture that the evaluation unit 24 can also further include compensation algorithms for compensating inaccuracies in the scanning head and/or on the scale. The parameters for the compensation algorithms can, for example, be determined in advance with the aid of a temporarily arranged particularly accurate scale and/or during operation (for example, accurately ascertaining the values of $I_i$ with the aid of the respectively assigned determined spacings $a_1$ and $a_2$).

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A measuring device for determining a position and/or a speed, comprising:
    a scale having marks arranged in spaced-apart relationship and designed as magnets or as magnetizable components; and
    a scanning head, wherein the scale and the scanning head are arranged for movement relative to one another along a movement direction, said scanning head constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing, said scanning head having at least two measuring systems for determining the first spacing and the second spacing, each said measuring system having a measuring rod and a sensor device which generates an electric pulse that traverses the measuring rod and generates a structure borne sound wave at one of the marks, with the sensor device recording a temporal arrival of the structure borne sound wave.

2. The measuring device of claim 1, wherein the first mark and the second mark are arranged successively.

3. The measuring device of claim 1, wherein the marks are arranged in succession with different spacings from one another, each of the spacings between two successive marks being unique.

4. The measuring device of claim 1, wherein the marks are spaced apart equidistantly.

5. The measuring device of claim 1, wherein each of the measuring systems has a magnet that magnetizes a single or a number of magnetizable components in immediate vicinity of the magnet.

6. A measuring device for determining a position and/or a speed, comprising:
   a scale having marks arranged in spaced-apart relationship and designed as magnets or as magnetizable components; and
   a scanning head, wherein the scale and the scanning head are arranged for movement relative to one another along a movement direction, said scanning head constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing, said scanning head including a measuring system for determining the first spacing and the second spacing, said measuring system having a sensor device and a measuring rod which is defined by a length sized to at least correspond to a spacing between three successive marks, said sensor device generating an electric pulse that traverses the measuring rod and generates a structure borne sound wave at each of at least two successive marks, with the sensor device recording a temporal arrival of the two structure borne sound waves, wherein the measuring system has a magnet that magnetizes a single or a number of magnetizable components in immediate vicinity of the magnet.

7. The measuring device of claim 6, wherein the first mark and the second mark are arranged successively.

8. The measuring device of claim 6, wherein the marks are arranged in succession with different spacings from one another, each of the spacings between two successive marks being unique.

9. The measuring device of claim 6, wherein the marks are spaced apart equidistantly.

10. A measuring device for determining a position and/or a speed, comprising:
    a scale having marks arranged in spaced-apart relationship and designed in the form of reflecting marks; and
    a scanning head, wherein the scale and the scanning head are arranged for movement relative to one another along a movement direction, said scanning head constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing, said scanning head having at least three measuring systems, each having a light source for generating light, a code scale having transparent and opaque sites in accordance with a coding, and a detector, wherein the light source, the code scale, and the detector are arranged to project a light distribution pattern onto the scale in accordance with the coding, with the detector detecting a part of the light distribution pattern which part has been reflected by a mark.

11. The measuring device of claim 10, wherein the coding is designed as Gray coding.

12. The measuring device of claim 10, wherein the first mark and the second mark are arranged successively.

13. The measuring device of claim 10, wherein the marks are arranged in succession with different spacings from one another, each of the spacings between two successive marks being unique.

14. The measuring device of claim 10, wherein the marks are spaced apart equidistantly.

15. A measuring device for determining a position and/or a speed, comprising:
    a scale having marks arranged in spaced-apart relationship; and
    a scanning head, wherein the scale and the scanning head are arranged for movement relative to one another along a movement direction, said scanning head constructed to determine a first spacing of the scanning head in the movement direction relative to a first one of the marks, and a second spacing of the scanning head in the movement direction relative to a second one of the marks, with the position and/or the speed being determined on the basis of the first spacing and the second spacing,
    wherein the measuring device is constructed to ascertain a position to be expected from a penultimately determined position on the basis of the determined first spacing associated to the penultimately determined position and/or of the second spacing, and to detect in response to the determined first spacing associated to a last determined position and/or of the second spacing an incorrectly determined position and/or speed in the absence of a match between the last determined position and the position to be expected.

16. The measuring device of claim 15, wherein the marks are designed as magnets or as magnetizable components, said scanning head including a measuring system for determining the first spacing and the second spacing, said measuring system having a sensor device and a measuring rod which is defined by a length sized to at least correspond to a spacing between three successive marks, said sensor device generating an electric pulse that traverses the measuring rod and generates a structure borne sound wave at each of at least two successive marks, with the sensor device recording a temporal arrival of the two structure borne sound waves.

17. The measuring device of claim 15, wherein the first mark and the second mark are arranged successively.

18. The measuring device of claim 15, wherein the marks are arranged in succession with different spacings from one another, each of the spacings between two successive marks being unique.

19. The measuring device of claim 15, wherein the marks are spaced apart equidistantly.

* * * * *